(12) United States Patent
Kiehlbauch

(10) Patent No.: US 9,090,460 B2
(45) Date of Patent: Jul. 28, 2015

(54) PLASMA PROCESSING WITH PREIONIZED AND PREDISSOCIATED TUNING GASES AND ASSOCIATED SYSTEMS AND METHODS

(71) Applicant: Micron Technology, Inc., Boise, ID (US)

(72) Inventor: Mark Kiehlbauch, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/272,928

(22) Filed: May 8, 2014

(65) Prior Publication Data

US 2014/0238955 A1    Aug. 28, 2014

Related U.S. Application Data

(62) Division of application No. 12/107,165, filed on Apr. 22, 2008, now Pat. No. 8,721,836.

(51) Int. Cl.
| | |
|---|---|
| *H01J 37/32* | (2006.01) |
| *C23C 16/455* | (2006.01) |
| *B44C 1/22* | (2006.01) |
| *C03C 15/00* | (2006.01) |
| *C03C 25/68* | (2006.01) |
| *B81C 1/00* | (2006.01) |

(52) U.S. Cl.
CPC ....... *B81C 1/00531* (2013.01); *H01J 37/32009* (2013.01); *H01J 37/32449* (2013.01); *H01J 37/32541* (2013.01); *C23C 16/45521* (2013.01)

(58) Field of Classification Search
None
See application file for complete search history.

(56) References Cited

U.S. PATENT DOCUMENTS

| | | |
|---|---|---|
| 5,554,255 A | 9/1996 | Karner et al. |
| 6,263,829 B1 | 7/2001 | Schneider et al. |
| 6,352,594 B2 | 3/2002 | Cook et al. |
| 6,518,692 B2 | 2/2003 | Schoenbach et al. |
| 6,626,998 B1 | 9/2003 | Dunham |
| 7,018,940 B2 | 3/2006 | Dunham |

(Continued)

FOREIGN PATENT DOCUMENTS

| | | |
|---|---|---|
| DE | 10044655 A1 | 4/2002 |
| JP | 2005072347 A | 3/2005 |

(Continued)

OTHER PUBLICATIONS

Schoenbach, K.H. et al., "Microhollow cathode discharges," Appl. Phys. Lett. 68, pp. 13-15, Jan. 1996, American Institute of Physics.

(Continued)

*Primary Examiner* — Allan Olsen
*Assistant Examiner* — Margaret D Klunk
(74) *Attorney, Agent, or Firm* — Perkins Coie LLP

(57) ABSTRACT

Plasma processing systems and methods for using pre-dissociated and/or pre-ionized tuning gases are disclosed herein. In one embodiment, a plasma processing system includes a reaction chamber, a support element in the reaction chamber, and one or more cathode discharge assemblies in the reaction chamber. The reaction chamber is configured to produce a plasma in an interior volume of the chamber. The support element positions a microelectronic workpiece in the reaction chamber, and the cathode discharge assembly supplies an at least partially dissociated and/or ionized tuning gas to the workpiece in the chamber.

18 Claims, 4 Drawing Sheets

(56) References Cited

U.S. PATENT DOCUMENTS

| | | |
|---|---|---|
| 7,169,231 B2 | 1/2007 | Larson et al. |
| 7,270,713 B2 | 9/2007 | Blonigan et al. |
| 7,303,141 B2 | 12/2007 | Han et al. |
| 7,832,354 B2 | 11/2010 | Katz et al. |
| 2003/0000473 A1 | 1/2003 | Chae et al. |
| 2004/0129211 A1 | 7/2004 | Blonigan et al. |
| 2005/0006346 A1 | 1/2005 | Annapragada et al. |
| 2005/0241763 A1 | 11/2005 | Huang et al. |
| 2005/0268856 A1 | 12/2005 | Miller et al. |
| 2006/0028145 A1 | 2/2006 | Mohamed et al. |
| 2006/0054279 A1 | 3/2006 | Kim et al. |
| 2007/0017636 A1 | 1/2007 | Goto et al. |
| 2007/0021935 A1 | 1/2007 | Larson et al. |
| 2007/0066038 A1 | 3/2007 | Sadjadi et al. |
| 2007/0086144 A1 | 4/2007 | Steger |
| 2007/0148366 A1 | 6/2007 | Selwyn et al. |
| 2007/0158025 A1 | 7/2007 | Larson |
| 2007/0193687 A1 | 8/2007 | Kagoshima et al. |
| 2007/0193688 A1* | 8/2007 | Dhindsa et al. .......... 156/345.43 |
| 2007/0235660 A1 | 10/2007 | Hudson |
| 2007/0247075 A1 | 10/2007 | Kim et al. |
| 2007/0251642 A1 | 11/2007 | Bera et al. |
| 2007/0254486 A1 | 11/2007 | Bera et al. |
| 2008/0020583 A1 | 1/2008 | Ueda et al. |
| 2008/0045031 A1 | 2/2008 | Hirotsu et al. |
| 2008/0179287 A1* | 7/2008 | Collins et al. .................. 216/67 |
| 2009/0057269 A1* | 3/2009 | Katz et al. ....................... 216/67 |
| 2009/0260763 A1 | 10/2009 | Kiehlbauch |

FOREIGN PATENT DOCUMENTS

| | | |
|---|---|---|
| WO | 0219379 A1 | 3/2002 |
| WO | 2004055855 A2 | 7/2004 |

OTHER PUBLICATIONS

Kiehlbauch, M.W. et al., "Effect of neutral transport on the etch product lifecycle during plasma etching of silicon in chlorine gas," J. Vac. Sci. Technol. A 21(1), pp. 116-126, Jan./Feb. 2003, American Vacuum Society.

Stine, B.E. et al., Analysis and Decomposition of Spatial Variation in Integrated Circuit Processes and Devices, IEEE Transactions on Semiconductor Manufacturing, vol. 10, No. 1, pp. 24-41, Feb. 1997.

Nagase, M. et al., Advanced CD Control Technology for 65-nm Node Dual Damascene Process, IEEE Transactions on Semiconductor Manufacturing, vol. 20, No. 3, pp. 245-251, Aug. 2007.

Wilson, C.G. et al., Miniaturized Magnetic Nitrogen Dc Microplasmas, IEEE Transactions on Plasma Science, vol. 32, No. 1, pp. 282-287, Feb. 2004.

Schoenbauch, K.H. et al., Micro Hollow Cathode Discharge, 1995 IEEE International Conference on Plasma Science, Physical Electronics Research Institute, Old Dominion University, Norfolk, Virginia, IEEE Conference Record—Abstracts, p. 186, Jun. 1995.

* cited by examiner

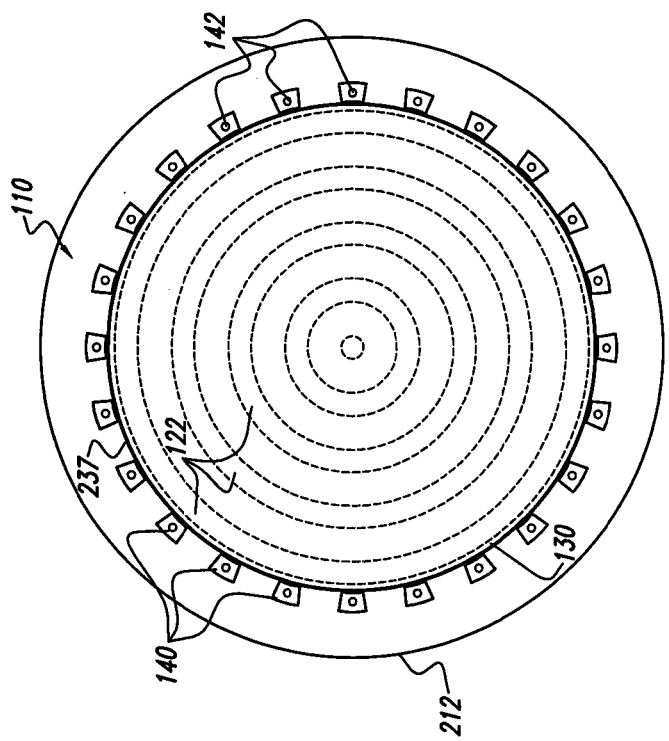
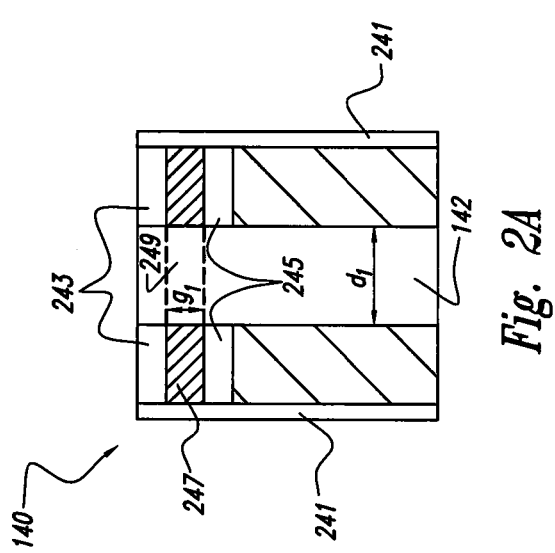
Fig. 2B
Fig. 2A

PLASMA PROCESSING WITH PREIONIZED AND PREDISSOCIATED TUNING GASES AND ASSOCIATED SYSTEMS AND METHODS

CROSS-REFERENCE TO RELATED APPLICATION

This application is a divisional of U.S. application Ser. No. 12/107,165 filed Apr. 22, 2008, now U.S. Pat. No. 8,721,836, which is incorporated herein by reference in its entirety.

TECHNICAL FIELD

The present disclosure is related to etching microelectronic workpieces using a plasma.

BACKGROUND

Etching procedures are widely used in the manufacturing of microelectronic and micromechanical devices to form features on a workpiece. The size of the individual components in the devices is decreasing and the number of layers in the devices is increasing. As a result, the density of the components and the aspect ratios of features are increasing to reduce the size of the individual dies and increase the performance. Moreover, the size of the workpieces is also increasing to provide more surface area for forming more dies on a single workpiece. Many fabricators, for example, are now using 300 mm workpieces, and even larger workpieces will likely be used in the future. As a result, etching techniques should produce highly uniform trenches, holes, and other features across the workpieces.

One challenge of plasma etching processes is to provide a uniform etch profile across the surface of a workpiece. Plasma etching systems typically include a reaction chamber, a gas distributor, and a chuck. In one type of plasma etching system, the gas distributor typically is electrically conductive and defines one electrode and the chuck is often another electrode for forming a plasma. The plasma includes a variety of reactive species (e.g., ionized and/or dissociated species) corresponding to a specific process gas provided by the gas distributor. These reactive species physically and/or chemically etch the surface of the workpiece. In general, the chamber, the chuck, and the plasma can have a variety of thermal, electrical, and/or chemical properties that affect the rate at which the reactive species remove material from the workpiece. If the properties of the plasma vary relative to the workpiece surface, this can in turn create non-uniform etch rates across the workpiece surface and other variations in etching parameters.

BRIEF DESCRIPTION OF THE DRAWINGS

FIGS. 2A and 2B are cross-sectional and top-plan views of individual cathode discharge assemblies employed in the reactor of FIG. 1.

DETAILED DESCRIPTION

Various embodiments of plasma processing systems and methods of using a plasma to etch a surface of a microelectronic workpiece are described below. The term "surface" can encompass planar and nonplanar surfaces, either with or without patterned and nonpatterned features, of a microelectronic workpiece. Such a workpiece can include one or more conductive and/or nonconductive layers (e.g., metallic, semiconductive, and/or dielectric materials) that are situated upon or within one another. These conductive and/or nonconductive layers can also contain a myriad of electrical elements, mechanical elements, and/or systems of such elements in the conductive and/or nonconductive layers (e.g., an integrated circuit, a memory, a processor, a microelectromechanical system (MEMS), etc.). Other embodiments of plasma processing systems or methods of plasma processing in addition to or in lieu of the embodiments described in this section may have several additional features or may not include many of the features shown and described below with reference to FIGS. 1-4. For example, the described embodiments generally employ reaction chambers with charge coupled plasma (CCP) sources; however, other embodiments can employ reaction chambers with inductively coupled plasma (ICP) sources.

Figure 1:
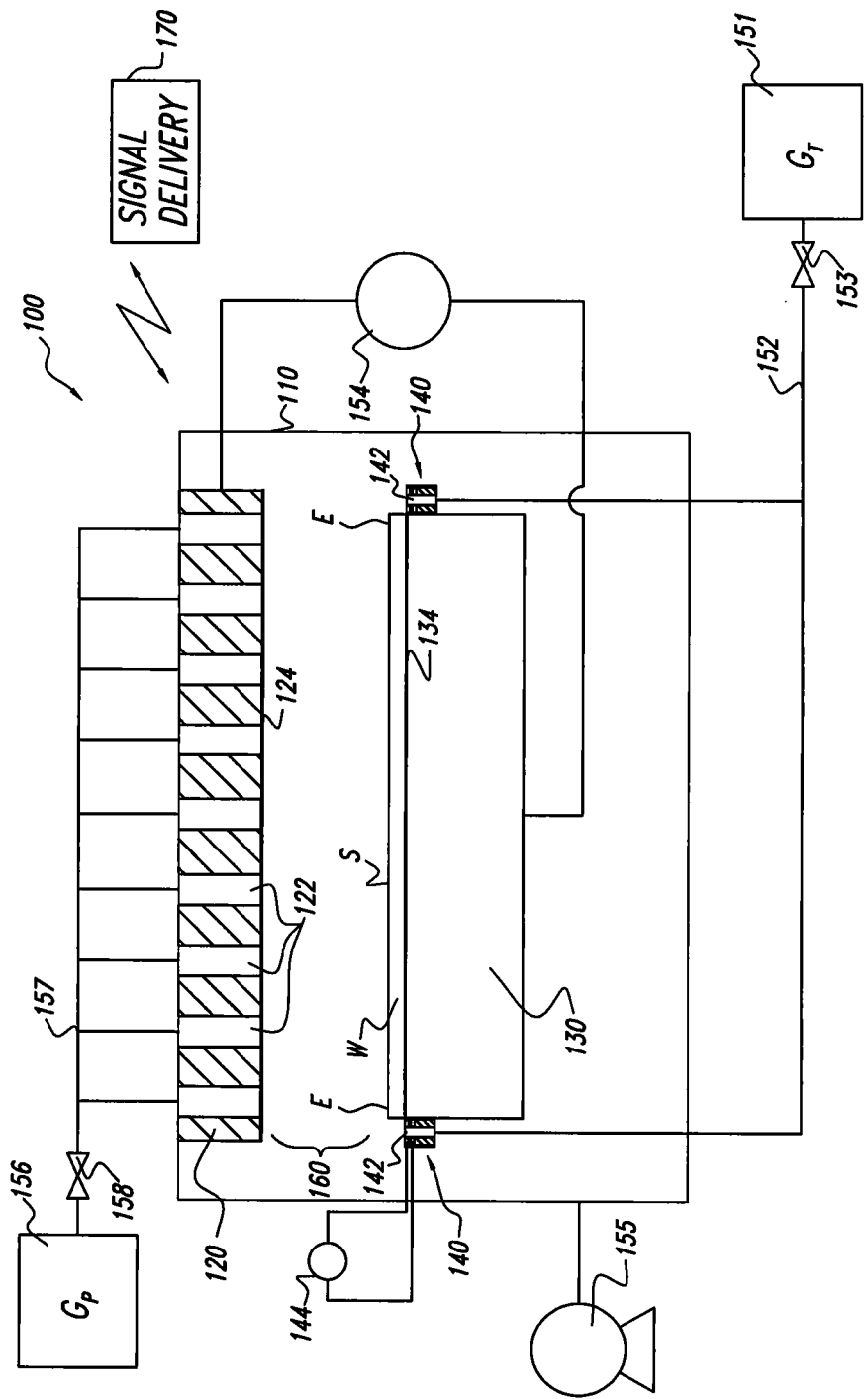
FIG. 1 is a cross-sectional side view of a plasma reactor configured in accordance with an embodiment of the disclosure.

FIG. 1 is a cross-sectional side view of a plasma reactor 100 having a reaction chamber 110, a gas distributor 120 in the chamber 110, a support element 130 carrying a workpiece W, and cathode discharge assemblies 140 adjacent to the support element 130. The cathode discharge assemblies 140 can be discrete units around the perimeter of the support element 130. The chamber 110 is configured to produce a plasma zone 160 between the gas distributor 120 and the support element 130, and the cathode discharge assemblies 140 are configured to deliver a pre-dissociated and/or pre-ionized tuning gas $G_T$ to an edge E of the workpiece W. Individual cathode discharge assemblies 140 include a flow port 142 for flowing the tuning gas $G_T$ into an interior volume of the chamber 110. The flow port 142, for example, can be operably coupled to a gas supply 151 of the tuning gas $G_T$ having a feed line 152 and a valve 153. The individual cathode discharge assemblies 140 are also coupled to a power supply 144 for producing a time-varying electric field within the individual flow ports 142 and outside of the plasma zone 160. In operation, the electric field disassociates and/or ionizes the tuning gas $G_T$ as it flows through the flow port 142 to produce reactive species within the tuning gas $G_T$. These reactive species include disassociated and/or ionized chemical species that locally etch/passivate the workpiece edge E to control etch-rate characteristics across a surface S of the workpiece W.

The gas distributor 120 includes flow ports 122 for flowing a process gas $G_P$ into the interior volume of the chamber 110. The flow ports 122, for example, can be operably coupled to a gas supply 156 of the process gas $G_P$ having a feed line 157 and a valve 158. The gas distributor 120 also includes an electrode surface 124 electrically coupled to a power supply 154 for producing a first time-varying electrical potential at the electrode surface 124. Similarly, the support element 130 includes an electrode surface 134 electrically coupled to the power supply 154 for providing a second time-varying electrical potential at the electrode surface 134. The second electrical potential works in combination with the first electrical potential to at least partially dissociate and/or ionize the process gas $G_P$ to produce the plasma zone 160 between the electrode surfaces 124 and 134. The support element 130 is also configured to position the workpiece W within the plasma zone 160 for chemical and/or reactive plasma etching of the workpiece surface S. In many embodiments, the reactor 100 also includes an exhaust system 155 (e.g., a vacuum system) for controlling the pressure in the chamber 110 and/or for evacuating the process and tuning gases $G_P$ and $G_T$ from the chamber 110.

The reactor 100 can further include a signal delivery device 170 operably coupled to various mechanical and electrical components of the reactor 100 to control etching parameters across the workpiece surface S and at the workpiece edge E. For example, the signal delivery device 170 can control the valves 153 and 158 and/or mass flow controllers (not shown) downstream from the valves 153 and 158 to adjust the flow rates and/or pressures of the process gas $G_P$ and the tuning gas $G_T$. The signal delivery device 170 can also control the power supply 154 to provide electrical potentials at specific frequencies within the chamber 110 and the power supply 144 to apply specific field strengths across the flow ports 142 of the cathode discharge assemblies 140. Further, the signal delivery device 170 can also control other components such as heating elements (not shown) in the chamber 110 for heating the workpiece W. In many embodiments, the signal delivery device 170 can be programmable to create automatic or semiautomatic programs. The automatic or semiautomatic programs can control the mechanical and/or electrical components of the reactor to affect specific etching parameters at the workpiece surface S. In other embodiments, the signal delivery device 170 can be omitted, and an operator can control the mechanical and electrical components of the reactor 110 to affect specific etching parameters.

The profile, selectivity, critical dimension (CD) control, and etch-rate uniformity across the workpiece are several etching parameters that should be controlled in the reactor 100. In conventional plasma reactors, the outer 10-20 mm of a workpiece surface is the most susceptible to these etching parameters. As described above, etching parameters can be influenced by a combination of thermal, electrical, and/or chemical properties within a plasma reactor. One way in which conventional plasma reactors compensate for variations in etching parameters at the workpiece edge is by delivering a conventional tuning gas to the reaction chamber. The tuning gas is typically delivered through the primary gas distributor situated above the workpiece. For example, tuning gases are generally delivered through outer flow ports of the primary gas distributor that are aligned with the workpiece edge. Typically, the outer flow ports flow the tuning gas through the plasma zone in the reaction chamber en route to the workpiece edge. As the tuning gas passes through the plasma, a portion of the chemical species in the tuning gas ionizes and dissociates to form reactive species that etch/passivate the workpiece edge. For example, this portion of the chemical species can compensate for etch-rate variation by increasing/decreasing the etch rate at the workpiece edge. However, another portion of the chemical species in the tuning gas affects overall etch-rate characteristics across the workpiece surface. This other portion includes chemical species that are less reactive because they have not been dissociated or ionized. These species diffuse away from the workpiece edge, and the plasma dissociates and/or ionizes them at a later time. When these species dissociate and/or ionize, they are typically no longer at the workpiece edge but have diffused across the workpiece surface to etch the workpiece surface in an uncontrolled manner.

In contrast to conventional plasma reactors, embodiments of the plasma reactor 100 employ a pre-dissociated and/or pre-ionized tuning gas to overcome this trade-off between etching parameters at the edge of a workpiece and overall etch-rate characteristics. In many embodiments, cathode discharge assemblies can be configured to output a tuning gas having a majority population of reactive species and a negligible population of nondissociated and/or nonionized species. Accordingly, the reactive species can etch the workpiece edge with little or no diffusion of nondissociated and/or nonionized species across the workpiece surface. The field strength of the electric field in the cathode discharge assemblies and/or the pressure of the tuning gas can be configured to produce a majority of reactive species and a minority nondissociated and/or nonionized species. For example, a cathode discharge assembly can have flow ports with plasma densities on the order of $10^{15}$ cm$^{-3}$ or greater and electron energies on the order of 1-10 eV.

FIG. 2A is a cross-sectional side view of an embodiment of an individual cathode discharge assembly 140. In this embodiment, the cathode discharge assembly 140 includes a dielectric casing 241 for electrically isolating the cathode discharge assembly 140 from the support element 130 (FIG. 1), a cathode 243, an anode 245, an insulator 247 separating the cathode 243 from the anode 245 by a gap $g_1$. The cathode 243 and the anode 245 are electrically coupled to the power supply 144 (FIG. 1) for producing an electric field region 249 across a volume defined by the gap $g_1$ and a diameter $d_1$ of the flow port 142. The flow port 142 extends through the cathode 243, the anode 245, and the insulator 247 to flow the tuning gas $G_T$ (FIG. 1) through the electric field region 249 to ionize and/or dissociate the tuning gas $G_T$. In many embodiments, the gap g1 and the diameter $d_1$ are less than 1 mm and define a volume of the electric field region 249. In some embodiments, however, the gap $g_1$ and/or the diameter $d_1$ can have different dimensions. For example, the diameter $d_1$ of the flow port 142 can be larger/smaller between the cathode 243 and the anode 245 relative to the diameter of the flow port 142 outside of the electric field region 249.

FIG. 2B is a top-plan view of an arrangement of a plurality of individual cathode discharge assemblies 140 within the chamber 110. The cathode discharge assemblies 140 can be at an outer perimeter 237 (e.g., a circumference) of the support member 130. The flow ports 142 of the cathode discharge assemblies 140 generally direct the tuning gas $G_T$ in a first direction transversely (e.g., non-parallel) away from the plane in which the workpiece is held. FIG. 2B also shows the flow ports 122 (drawn in phantom) of the gas distributor 120 (FIG. 1) positioned above the support element 130. The flow ports 122 of the gas distributor 120 direct the process gas $G_P$ in a second direction toward the plane in which the workpiece is held. In other embodiments, the cathode discharge assemblies 140, the flow ports 142, and/or the flow ports 122 can have different configurations within the reaction chamber 110. For example, the cathode discharge assemblies 140 can be mounted to a wall 212 of the chamber 110. In some embodiments, the flow ports 142 can also be positioned such that they are generally perpendicular to the plane in which the workpiece is held. Further, in alternative embodiments, the chamber 110 can include more or fewer cathode discharge assemblies, such as a single annular cathode discharge assembly that surrounds all or a portion of the support element 130.

Figure 3:
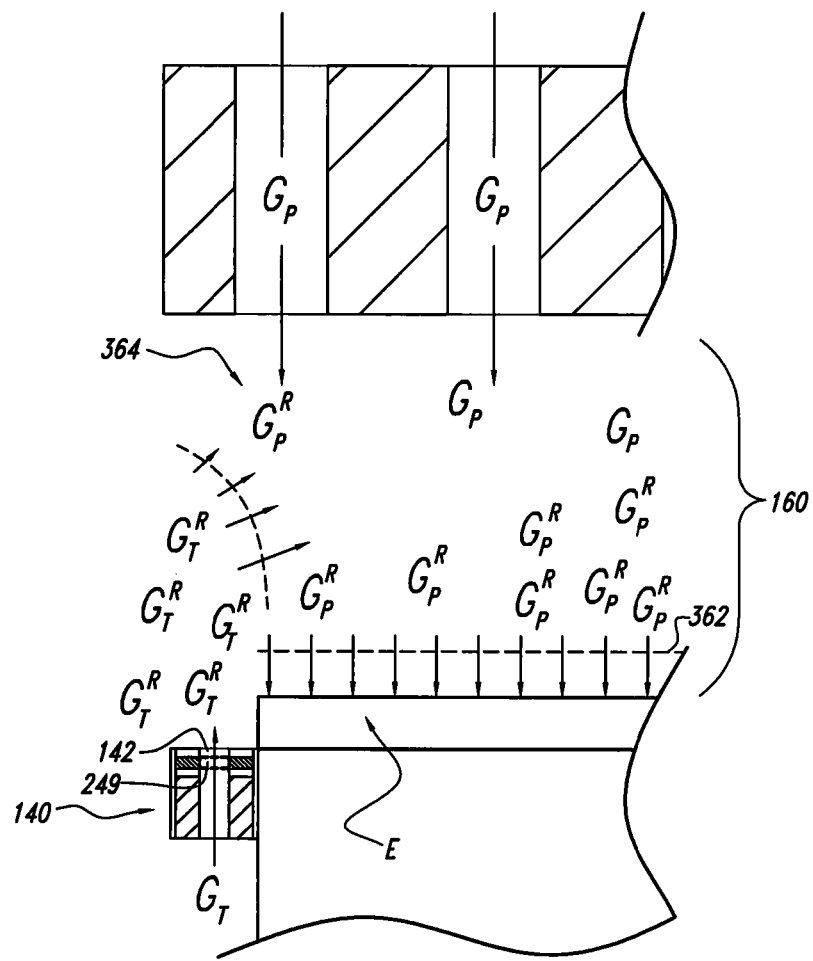
FIG. 3 is a partial cross-sectional side view illustrating etching a microelectronic workpiece in the reactor of FIG. 1 in greater detail.

FIG. 3 is a blow-up, partial cross-sectional side view of the workpiece edge E during a plasma etching process in the chamber 110 of the reactor 100 (FIG. 1). FIG. 3 shows the plasma zone 160 including first reactive species $G_P^R$ of the process gas $G_P$. There is a smaller concentration of the first reactive species $G_P^R$ near the workpiece edge E and a larger concentration away from the workpiece edge E. To provide a more uniform concentration of reactive species, the cathode discharge assembly 140 outputs a stream of second reactive species $G_T^R$ that etch/passivate the workpiece edge E while the workpiece surface is concurrently etched by the first reactive species $G_P^R$ in the plasma zone 160. More specifically, the electric field region 249 dissociates and/or ionizes the tuning gas $G_T$ to produce the second reactive species $G_T^R$. These species can then exit the flow port 142 and chemically and/or physically react at the workpiece edge E. In some embodiments, the second reactive species $G_T^R$ can enter a sheath 362 of the plasma zone 160 at the workpiece edge E, and the sheath 362 can accelerate ionized second reactive species $G_T^R$ towards the workpiece edge E. In many embodiments, the magnitude and/or frequency of the electric field region 249 can be configured to fully dissociate and/or ionize the tuning gas $G_T$ such that only a negligible population of nondissociated and/or nonionized chemical species enters the chamber 110. In some embodiments, the pressure of the tuning gas $G_T$ can also be adjusted to affect dissociation and/or ionization of the tuning gas $G_T$. Further, the amount of the second reactive species $G_T^R$ output into the chamber 110 can also be configured such that all of the second reactive species $G_T^R$ are consumed by the reactions at the workpiece edge E. Accordingly, very few or none of the second reactive species $G_T^R$ can migrate or diffuse away from the workpiece edge E or enter a bulk region 364 of the plasma zone 160.

Figure 4:
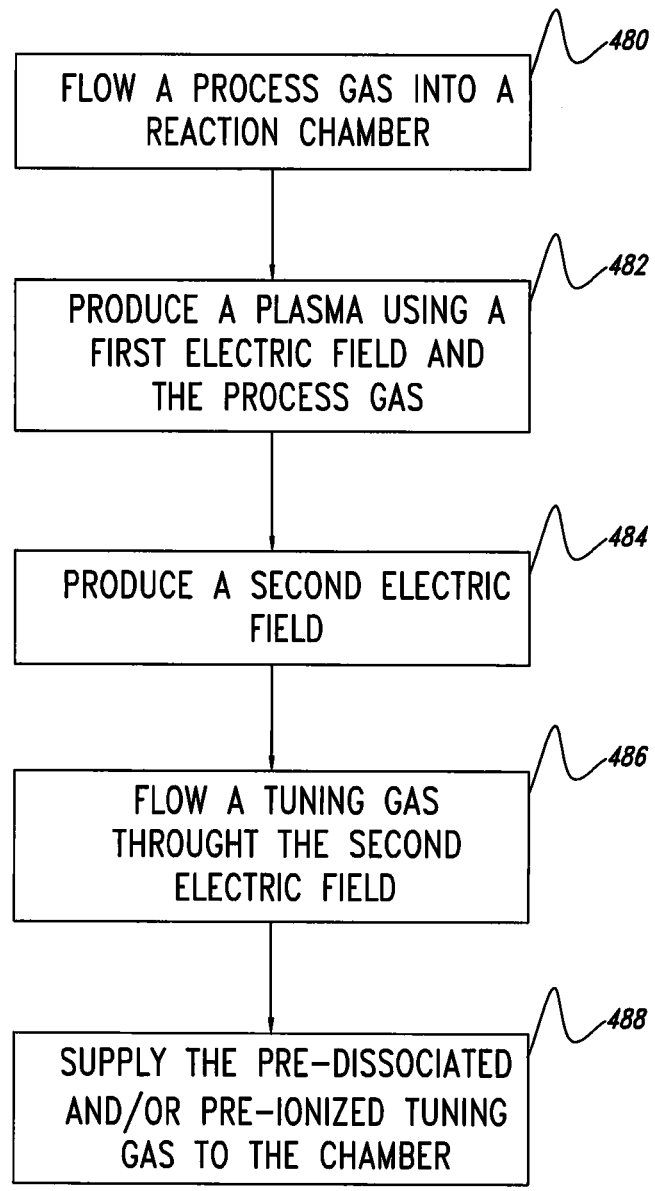
FIG. 4 is a flow diagram of an embodiment of a plasma etching process employing a pre-dissociated and/or a pre-ionized tuning gas.

FIG. 4 is a flow diagram showing an example plasma etching process using various embodiments of the process gas $G_P$ and the tuning gas $G_T$ in the chamber 110. In one example, a silicon-oxide plasma etching process can employ a process gas of $C_4F_8/O_2/A_r$ for bulk etching of a workpiece and a tuning gas of $O_2$ for etching at an edge of the workpiece. Alternatively, the etching process can employ a tuning gas of $C_4F_8/C_4F_6$ for reducing the etch rate at the workpiece edge by passivating the workpiece edge with an organic material. The oxide etching process first includes flowing the $C_4F_8/O_2/Ar$ process gas into a reaction chamber (block 480) and producing a first electric field in the reaction chamber to create a $CF_4F_8/O_2$ plasma (block 482). The etching process also includes producing a second electric field (block 484) and flowing either the $O_2$ through the second electric field or the $C_4F_8/C_4F_6$ gas through the second electric field (block 486). For example, the cathode discharge assemblies 140 can produce a second electric field outside of the $CF_4F_8/O_2$ plasma. After dissociation and/or ionization via the second electric field, the $O_2$ gas or the $C_4F_8/C_4F_6$ gas can flow into the reaction chamber (block 488) and react with the workpiece edge.

As another example, a silicon etching process can employ a process gas of $Cl_2/HBr/O_2$ for bulk etching and a tuning gas of either $Cl_2$ or one of $O_2$, $SiH_4$, or $H_2$ for etching/passivating the edge of a workpiece. Referring to FIG. 4, the silicon etching process includes flowing the $Cl_2/HBr/O_2$ gas into the reaction chamber (block 480), producing a first electric field to produce a $Cl_2/HBr/O_2$ plasma (block 482), and producing a second electric field (block 484). The etching process also includes flowing the $Cl_2$ gas or one of the $O_2$, $SiH_4$, or $H_2$ gases through the second electric field (block 486) and flowing one of these pre-dissociated and/or pre-ionized gases into the reaction chamber to react with the workpiece edge (block 488).

As yet another example, a silicon-nitride etching process can employ a process gas of $CH_xF_y/O_2/Ar$ for bulk etching and a tuning gas of $O_2$ or $CH_xF_y$ for etching/passivating the edge of a workpiece. Referring to FIG. 4, the silicon-nitride etching process includes flowing the $CH_xF_y/O_2/Ar$ gas into the reaction chamber (block 480), producing a $CH_xF_y/O_2$ plasma via a first electric field (block 482), and producing a second electric field (block 484). The etching process also includes flowing the $O_2$ gas or the $CH_xF_y$ gas through the second electric field (block 486) and flowing one of these pre-dissociated and/or pre-ionized gases into the reaction chamber to react with the workpiece edge (block 488).

As still yet another example, a carbon etching process for removing materials such as photoresist, backside anti-reflective coating (BARC) and carbon hardmasks can employ a process gas such as $SO_2/O_2$, $N_2O_2$, or $CH_xF_y/O_2/N_2$ for bulk etching and a tuning gas of $O_2$ or $CH_xF_y$ for etching/passivating the edge of a workpiece. Referring to FIG. 4, the carbon etching process includes flowing one of the $SO_2/O_2$, $N_2O_2$, or $CH_xF_y/O_2/N_2$ gases into the reaction chamber (block 480), producing a $SO_2/O_2$, $N_2O_2$, or $CH_xF_y/O_2/N_2$ plasma via a first electric field (block 482), and producing a second electric field (block 484). The etching process also includes flowing the $O_2$ gas or the $CH_xF_y$ gas through the second electric field (block 486) and flowing one of these pre-dissociated and/or pre-ionized gases into the reaction chamber to react with the workpiece edge (block 488).

From the foregoing, it will be appreciated that specific embodiments of the invention have been described herein for purposes of illustration, but well-known structures and functions have not been shown or described in detail to avoid unnecessarily obscuring the description of the embodiments of the invention. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is inclusive and is used throughout to mean including at least the recited feature(s) such that any greater number of the same feature and/or additional types of other features are not precluded. It will also be appreciated that specific embodiments of the invention have been described herein for purposes of illustration, but that various modifications may be made without deviating from the inventions. For example, many of the elements of one embodiment can be combined with other embodiments in addition to, or in lieu of, the elements of the other embodiments. Furthermore, although the illustrated embodiments generally describe plasma processing in the context of chemically and/or reactively etching the surface of a microelectronic workpiece, other non-illustrated embodiments can employee plasma processing for other purposes such as for film deposition. Accordingly, the invention is not limited except as by the appended claims.

I claim:

1. A plasma processing method, comprising:
supplying a process gas to a reaction chamber and flowing the process gas through a gas distributor in a first direction toward a surface of a workpiece;
forming a plasma zone in the chamber using the process gas;
flowing a tuning gas through a cathode discharge assembly, forming an electric field at least partially between a cathode and an anode of the cathode discharge assembly, wherein the cathode and the anode of the cathode discharge assembly are positioned at around an outer perimeter of a support element carrying the workpiece, and wherein the electric field at least partially dissociates and/or ionizes the tuning gas; and
after flowing the tuning gas through the electric field, supplying the at least partially dissociated or ionized tuning gas to the plasma zone in the chamber proximate to a peripheral edge of the workpiece, wherein the tuning gas flows through an outlet of the cathode discharge assembly in a second direction different than the first direction of the process gas.

2. The method of claim 1 wherein the plasma zone is adjacent to a surface of the workpiece in the reaction chamber.

3. The method of claim 1 wherein supplying the tuning gas to the plasma zone includes flowing a stream of dissociated and/or ionized chemical species into the plasma zone in the second direction that is generally perpendicular to the surface of the workpiece.

4. The method of claim 1 wherein supplying the tuning gas to the plasma zone includes flowing a stream of reactive chemical species through an annular cathode discharge assembly about the peripheral edge of the workpiece.

5. The method of claim 4 wherein the at least partially dissociated or ionized tuning gas etches the edge of the workpiece and/or passivates the edge of the workpiece.

6. The method of claim 1 wherein the edge of the workpiece is etched by the at least partially dissociated or ionized tuning gas while the surface of the workpiece is etched and/or passivated by the process gas.

7. The method of claim 1 wherein the at least partially dissociated or ionized tuning gas is consumed primarily by reactions at the edge of the workpiece.

8. The method of claim 1 wherein multiple cathode discharge assemblies, each having a cathode and an anode, are positioned at or around the outer perimeter of the support element carrying the workpiece to form multiple electric fields that at least partially dissociate and/or ionize the tuning gas.

9. The method of claim 1 wherein the tuning gas is discharged on the same surface of the workpiece as the process gas.

10. A method for plasma processing of a microfeature workpiece, the method comprising:
    flowing a process gas to a reaction chamber through a gas distributor in a first direction;
    forming a plasma zone in the chamber using the process gas, wherein the plasma zone is at least partially above a surface of the workpiece;
    treating the surface of the workpiece in a plasma zone;
    forming an electric field at least partially between a cathode and an anode of a cathode discharge assembly, wherein the cathode and the anode of the cathode discharge assembly are positioned at or around an outer perimeter of a support element carrying the workpiece, and wherein the cathode discharge assembly is disposed radially outward of the workpiece;
    dissociating and/or ionizing a tuning gas in the electric field of the cathode discharge assembly;
    discharging the tuning gas proximate to a peripheral edge of the workpiece, wherein the tuning gas flows through an outlet of the cathode discharge assembly in a second direction different than the first direction of the process gas; and
    treating the edge of the workpiece with the dissociated and/or ionized tuning gas.

11. The method of claim 10 wherein dissociating and/or ionizing the tuning gas comprises flowing the tuning gas through a plurality of cathode discharge assemblies.

12. The method of claim 10 wherein the dissociated and/or ionized tuning gas includes a majority population of reactive chemical species that is larger than a minority population of nondissociated and/or nonionized chemical species.

13. The method of claim 12 wherein the majority population of reactive chemical species includes dissociated chemical species and/or ionized chemical species.

14. The method of claim 10 wherein the reactive chemical species etch the edge of the workpiece and/or passivate the edge of the workpiece.

15. The method of claim 10 wherein the tuning gas at the outlet of the cathode discharge assembly has density on the order of $10^{15}$ cm$^{-3}$ or greater and electron energies on the order of 1-10 eV.

16. The method of claim 10 wherein the outlet of the cathode discharge assembly is annular.

17. The method of claim 11 wherein the cathode discharge assemblies are disposed radially about the workpiece.

18. The method of claim 10 wherein the tuning gas is discharged on the same surface of the workpiece as the process gas.

* * * * *

UNITED STATES PATENT AND TRADEMARK OFFICE
CERTIFICATE OF CORRECTION

| | |
|---|---|
| PATENT NO. | : 9,090,460 B2 |
| APPLICATION NO. | : 14/272928 |
| DATED | : July 28, 2015 |
| INVENTOR(S) | : Mark Kiehlbauch |

It is certified that error appears in the above-identified patent and that said Letters Patent is hereby corrected as shown below:

In the claims,

In column 6, line 60, in claim 1, after "at" insert -- or --.

In column 7, line 27, in claim 8, delete "around the" and insert -- around an --, therefor.

Signed and Sealed this
Twenty-fourth Day of May, 2016

Michelle K. Lee
*Director of the United States Patent and Trademark Office*